United States Patent [19]
Yao

[11] Patent Number: 6,163,068
[45] Date of Patent: Dec. 19, 2000

[54] MULTI-CHIP SEMICONDUCTOR ENCAPSULATION METHOD AND ITS FINISHED PRODUCT

[76] Inventor: Hsia Kuang Yao, 14-1, Alley 33, Lane 105, Yeong Kang Rd., Feng-Yaun, Taichung, Taiwan

[21] Appl. No.: 09/296,865

[22] Filed: Apr. 22, 1999

[51] Int. Cl.[7] ............................................. H01L 23/495
[52] U.S. Cl. .................... 257/672; 257/685; 257/723; 257/666; 257/680; 257/735; 257/670
[58] Field of Search ................................ 257/672, 685, 257/723, 666, 680, 735, 670

[56] References Cited

U.S. PATENT DOCUMENTS

| | | | |
|---|---|---|---|
| 5,559,316 | 9/1996 | Tomoda | 257/666 |
| 5,936,305 | 8/1999 | Akram | 257/723 |

*Primary Examiner*—Minh Loan Tran
*Assistant Examiner*—Luan Thai

*Attorney, Agent, or Firm*—Pro-Techtor International Services

[57] ABSTRACT

A multi-chip semiconductor encapsulation method, which includes the steps of (1) preparing a leadframe having a center blank area and parallel rows of pins around said center blank area, (2) preparing a substrate having a plurality of chip positioning zones at the center area of the back side wall thereof, a window respectively disposed at the center of each chip positioning zone, conductor elements respectively disposed at the top side wall thereof around each window, and peripheral rows of terminals, (3) preparing a plurality of chips each having a plurality of solder tips and then fastening the chips to the chip positioning zones at the substrate, (4) using conductor wires to connect the solder tips at the chips to the conductor elements at the substrate, (5) mounting the substrate in the center blank area at the leadframe and then connecting the terminals at the substrate to the pins at the leadframe respectively, and (6) encapsulating the assembly of the substrate, the leadframe and the chip into a multi-chip semiconductor.

3 Claims, 5 Drawing Sheets

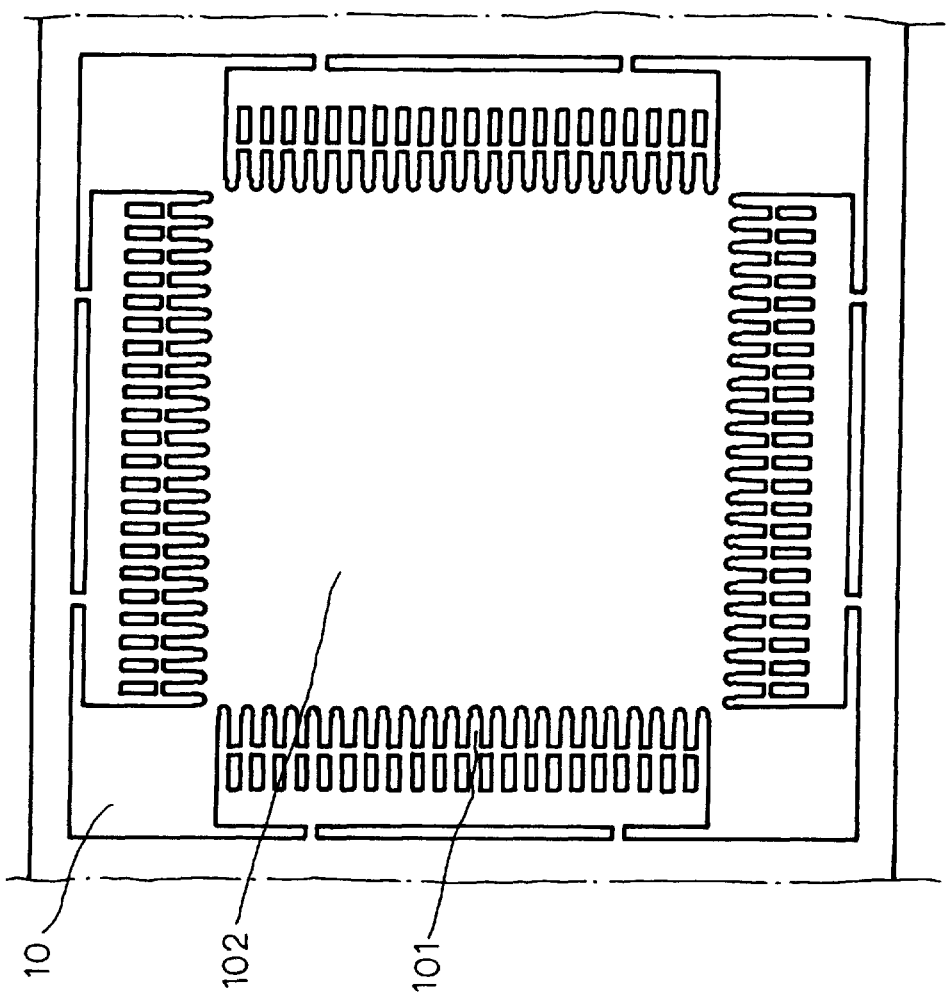

MULTI-CHIP SEMICONDUCTOR ENCAPSULATION METHOD AND ITS FINISHED PRODUCT

BACKGROUND OF THE INVENTION

The present invention relates to a semiconductor encapsulation method, and more particularly to a multi-chip semiconductor encapsulation method which enables multiple chips to be encapsulated into an integrated circuit. The invention relates also to a multi-chip semiconductor made according to this method.

Because modern computer systems are sophisticated, the effective capacity of related integrated circuits must be relatively expanded to meet the requirements. However, according to current chip manufacturing processes, the greater the capacity is the larger the chip dimension and the higher the chip manufacturing cost will be. Multichip encapsulation can increase the capacity without increasing much dimension.

SUMMARY OF THE INVENTION

It is one object of the present invention to provide a semiconductor encapsulation method which enables multiple chips to be encapsulated into an integrated circuit. It is another object of the present invention to provide an integrated circuit which has multiple chips encapsulated in it. A multi-chip semiconductor encapsulation method according to the present invention comprises the steps of:

(1) preparing a leadframe having a center blank area and parallel rows of pins around the center blank area;

(2) preparing a substrate having a plurality of chip positioning zones at the center area of the back side wall thereof, a window respectively disposed at the center of each chip positioning zone, conductor elements respectively disposed at the top side wall thereof around each window, and peripheral rows of terminals;

(3) preparing a plurality of chips each having a plurality of solder tips and then fastening the chips to the chip positioning zones at the substrate;

(4) using conductor wires to connect the solder tips at the chips to the conductor elements at the substrate;

(5) mounting the substrate in the center blank area at the leadframe and then connecting the terminals at the substrate to the pins at the leadframe respectively; and (6) encapsulating the assembly of the substrate, the leadframe and the chip into a multi-chip semiconductor.

A finished multi-chip semiconductor in accordance with the present invention comprises:

a leadframe, the leadframe having a center blank area, and parallel rows of pins disposed at at least two of four peripheral sides thereof around the center blank area;

a substrate mounted in the center blank area at the leadframe, the substrate comprising a plurality of chip positioning zones at the center area of a back side wall thereof, a window respectively disposed at the center of each of the chip positioning zones, conductor elements respectively disposed at a top side wall thereof around each window, and rows of terminals disposed at at least two of four peripheral sides thereof and respectively connected to the pins at the leadframe;

a plurality of chips respectively mounted in the chip positioning zones at the back side wall of the substrate, the chips each having a plurality of solder tips respectively suspended in the windows in the substrate corresponding to the conductor elements at the substrate; and conductor wires respectively connected between the solder tips at the chips and the conductor elements at the substrate.

DETAILED DESCRIPTION OF THE PREFERRED EMBODIMENT

Figure 1:
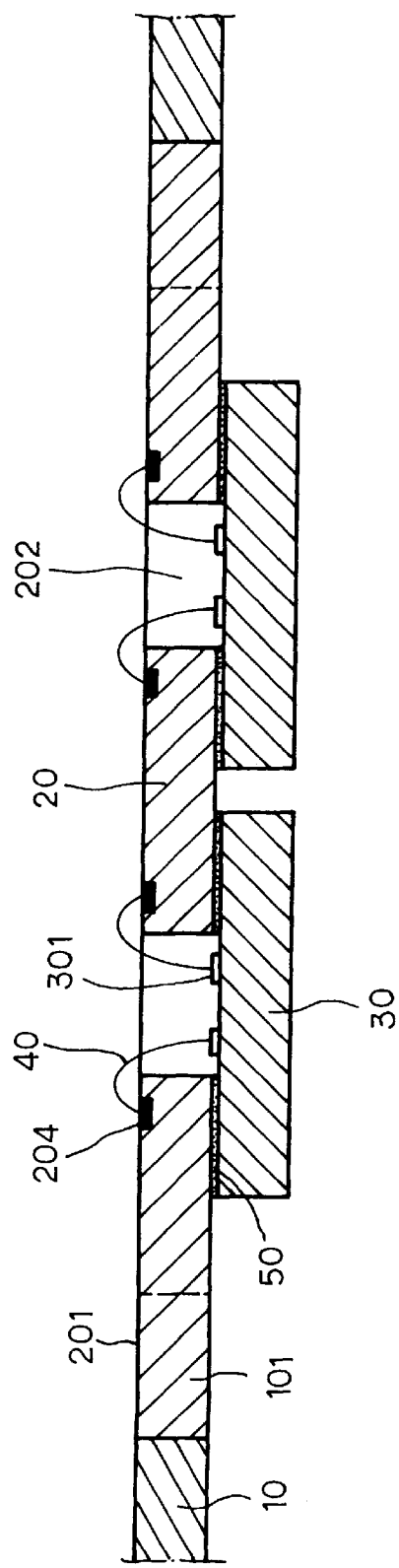
FIG. 1 is a sectional view of a multi-chip semiconductor according to one embodiment of the present invention.

FIG. 1 and FIGS. from 2A through 2D show a preferred embodiment of the present invention. This embodiment explains a 4-chip LOC (line of communication) encapsulation. However, the invention is not limited to this encapsulation.

Figure 2:
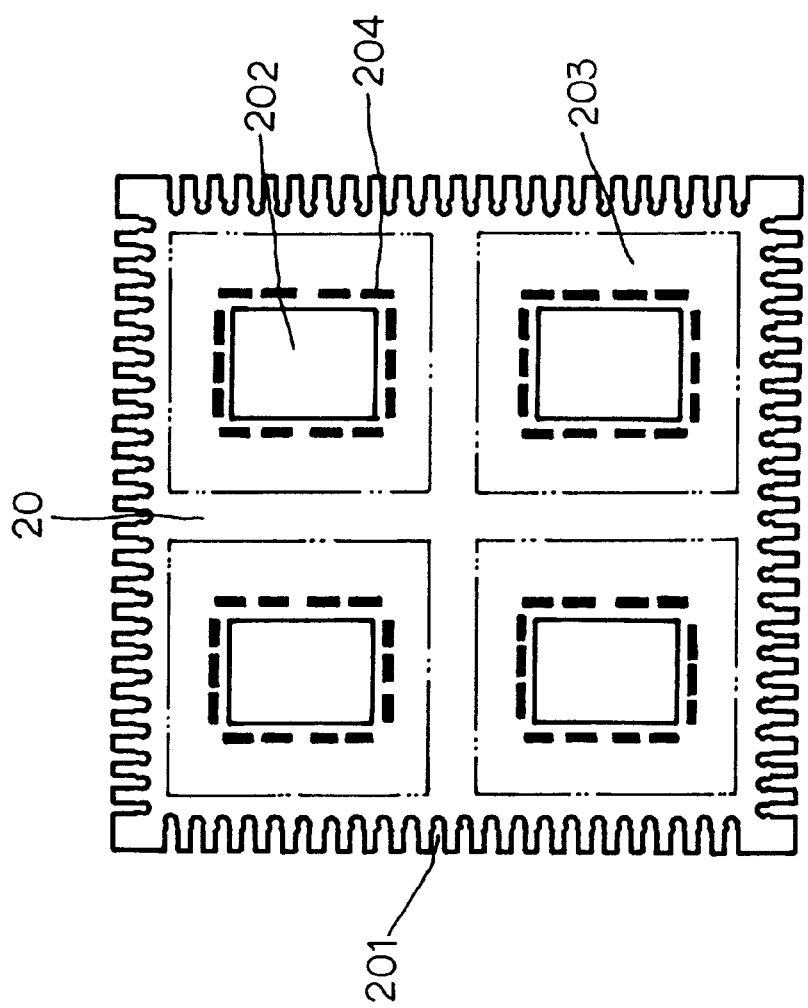
FIG. 2A is a schematic drawing showing the structure of a leadframe according to the present invention.
FIG. 2B is a schematic drawing showing the structure of a substrate according to the present invention.
FIG. 2C is a schematic drawing showing chips installed in chip positioning zones at the substrate according to the present invention.
FIG. 2D is a schematic drawings showing chips carried on the substrate, the substrate installed in the leadframe according to the present invention.

Referring to FIGS. 1 and 2A, a leadframe 10 is provided having a center blank area 102, which holds a substrate 20, and parallel rows of pins 101 disposed at two or four sides, for example, the four sides around the center blank area 102.

Referring to FIG. 2B and FIG. 1 again, a substrate 20 is 20 shown having a plurality of, for example, four chip positioning zones 203 at the center area of the back side wall thereof (see the imaginary lines) which hold a respective chip 30, a window 202 respectively disposed at the center of each of the chip positioning zones 203, conductor elements 204 respectively disposed at the top side wall thereof around each window 202 corresponding to respective solder tips 301 at the chip 30 in each of the chip positioning zones 203 for communication between the substrate 20 and each chip 30, and rows of terminals 201 at two or four sides, for example, the four sides around the periphery for enabling the substrate 20 to communicate with external means.

Figure 2C:
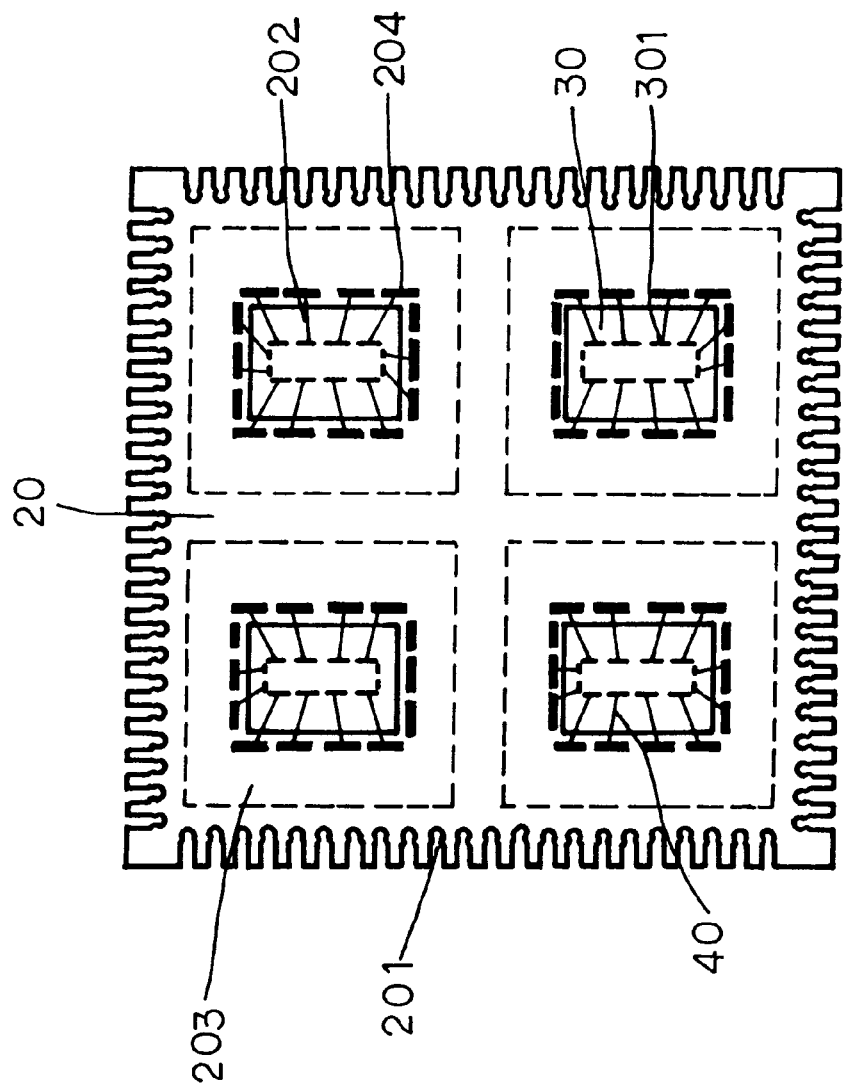

Referring to FIG. 2C and FIG. 1 again, the chips 30 are respectively adhered to the chip positioning zones 203 at the back side wall of the substrate 20 by for example double-sided adhesive means 50, and the solder tips 301 of the chips 30 are respectively suspended in the windows 202 in the substrate 20 corresponding to the conductor elements 204 at the substrate 20. Conductor wires 40 are respectively installed, and connected between the solder tips 301 at the chips 30 and the conductor elements 204 at the substrate 20. The conductor wires 40 can be gold-plated wires, silver-plated wires, or lead wires.

Figure 2D:
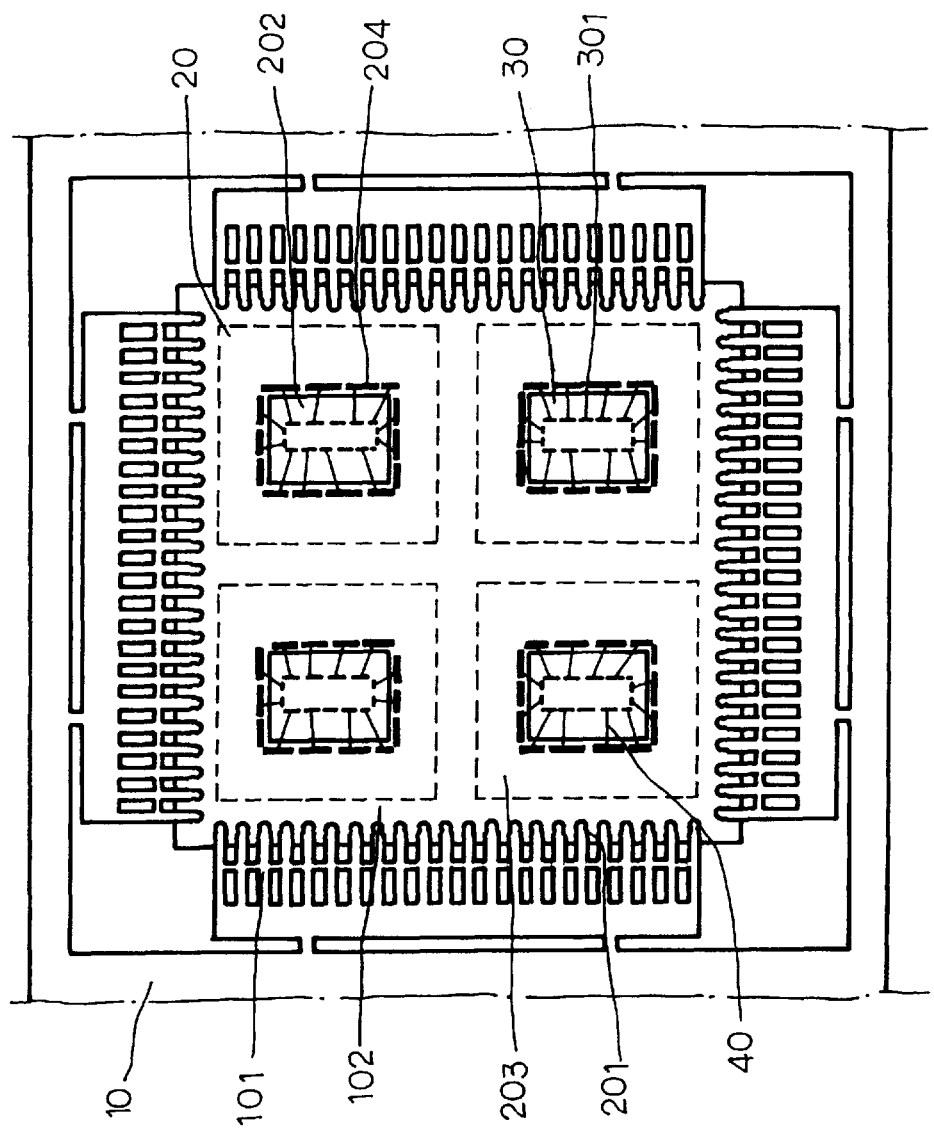

Referring to FIG. 2D and FIG. 1 again, the substrate 20 which carries the chips 30 is mounted in the center blank area 102 at the leadframe 10, and the terminals 201 of the substrate 20 are respectively soldered to the pins 101 at the leadframe 10. After installation of the substrate 20 in the leadframe 10, the whole assembly is encapsulated, and a multi-chip semiconductor is thus finished.

It is to be understood that the drawings are designed for purposes of illustration only, and are not to be used as a definition of the limitations and scope of the invention disclosed. For example, the solder tips 301 of each chip 30 can be provided at the peripheral area instead of the center area.

What the invention claimed is:

1. A multi-chip semiconductor comprising:

a leadframe, said leadframe having a center open area and at least two parallel rows of pins disposed at peripheral sides of said leadframe around said center open area;

a substrate mounted in said center open area of said leadframe such that said substrate and said leadframe lie in a single plane, said substrate comprising a plurality of chip positioning zones, a window being disposed at a center of each of said chip positioning zones, conductor elements being disposed at a top side wall of each window, and at least two rows of terminals projecting outward from peripheral sides of said substrate, said terminals being connected to said pins of said leadframe;

a plurality of chips mounted in said chip positioning zones at a back side wall of said substrate, said chips each having a plurality of solder tips respectively suspended in said windows in said substrate corresponding to respective conductor elements of said substrate; and conductor wires respectively connected between said solder tips of said chips and said conductor elements of said substrate.

2. The multi-chip semiconductor of claim 1 further comprising double-sided adhesive means securing said chips in said chip positioning zones at said back side wall of said substrate.

3. The multi-chip semiconductor of claim 1 further comprising an adhesive which adheres said chips in said chip positioning zones at said back side wall of said substrate.

* * * * *